(12) United States Patent
Cho et al.

(10) Patent No.: US 12,195,849 B2
(45) Date of Patent: Jan. 14, 2025

(54) APPARATUS FOR TRAPPING MULTIPLE REACTION BY-PRODUCTS FOR SEMICONDUCTOR PROCESS

(71) Applicant: MILAEBO CO., LTD., Pyeongtaek-si (KR)

(72) Inventors: Che Hoo Cho, Seoul (KR); Yeon Ju Lee, Osan-si (KR); Jin Woong Kim, Osan-si (KR); Ji Eun Han, Pyeongtaek-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 554 days.

(21) Appl. No.: 17/377,218

(22) Filed: Jul. 15, 2021

(65) Prior Publication Data
US 2022/0349053 A1    Nov. 3, 2022

(30) Foreign Application Priority Data
Apr. 28, 2021   (KR) .................. 10-2021-0055076

(51) Int. Cl.
C23C 16/44      (2006.01)
C23C 16/455     (2006.01)

(52) U.S. Cl.
CPC ........ C23C 16/4412 (2013.01); C23C 16/455 (2013.01)

(58) Field of Classification Search
None
See application file for complete search history.

(56) References Cited

U.S. PATENT DOCUMENTS

| 8,999,028 B2* | 4/2015 | Meng ................. C23C 16/4412 55/448 |
| 11,555,243 B2* | 1/2023 | Cho .................... C23C 16/4412 |
| 11,872,515 B2* | 1/2024 | Cho ....................... B01D 50/20 |
| 2009/0107091 A1* | 4/2009 | Cho .................... C23C 16/4412 55/440 |

(Continued)

FOREIGN PATENT DOCUMENTS

| KR | 10-0717837 B1 | 5/2007 |
| KR | 10-0862684 B1 | 10/2008 |

(Continued)

*Primary Examiner* — Jeffrie R Lund
*Assistant Examiner* — Tiffany Z Nuckols
(74) *Attorney, Agent, or Firm* — You & IP, LLC

(57) ABSTRACT

An apparatus is for trapping multiple reaction by-products for a semiconductor process, in which a trapping region is divided by a difference in vertical temperature distribution according to a distance spaced apart from a heater and by structures for switching flow path directions and generating multiple vortices using a trapping structure, and reaction by-product mixtures contained in a gas, which is discharged after a process of depositing multiple different thin film layers is performed in a process chamber during a semiconductor manufacturing process, is trapped by a single trapping apparatus, such that a reaction by-product, which is aggregated in the form of a thin film in a relatively high-temperature region, is trapped by a first trapping part in an upper region, and a reaction by-product, which is aggregated in the form of powder in a relatively low-temperature region, is trapped by a second trapping part in a lower region.

12 Claims, 10 Drawing Sheets

(56) References Cited

U.S. PATENT DOCUMENTS

| | | | | |
|---|---|---|---|---|
| 2009/0191109 A1* | 7/2009 | Tsuda | ............ | C23C 16/34 |
| | | | | 423/240 R |
| 2019/0194804 A1* | 6/2019 | Cho | ............ | H01L 21/67098 |
| 2020/0164296 A1* | 5/2020 | Cho | ............ | B01D 45/16 |
| 2020/0321226 A1* | 10/2020 | Cho | ............ | C23C 16/4412 |

FOREIGN PATENT DOCUMENTS

| KR | 20-2011-0006874 U | 7/2011 |
|---|---|---|
| KR | 10-1447629 B1 | 10/2014 |
| KR | 10-1806480 B1 | 1/2018 |
| KR | 10-1840332 B1 | 5/2018 |
| KR | 10-2020-0062901 A | 6/2020 |
| KR | 10-2228180 B1 | 3/2021 |

* cited by examiner

APPARATUS FOR TRAPPING MULTIPLE REACTION BY-PRODUCTS FOR SEMICONDUCTOR PROCESS

CROSS-REFERENCE TO RELATED APPLICATIONS

This application claims the priority of Korean Patent Application No. 10-2021-0055076 filed on Apr. 28, 2021, in the Korean Intellectual Property Office, the disclosure of which is incorporated herein by reference.

BACKGROUND

Field

The present disclosure relates to an apparatus for trapping multiple reaction by-products for a semiconductor process, and more particularly, to an apparatus for trapping multiple reaction by-products, the apparatus being capable of trapping a reaction by-product mixture contained in an unreacted gas discharged after multiple thin-film deposition processes are performed in a process chamber during a semiconductor manufacturing process, and the apparatus being capable of trapping the reaction by-product mixture in the form of a thin film or powder suitable for a trapping temperature region in the single trapping apparatus by dividing the trapping region with a structure for generating multiple vortices and switching flow path directions using a trapping structure and a difference in vertical temperature distribution according to a distance spaced apart from a heater.

Description of the Related Art

In general, a semiconductor manufacturing process is broadly divided into a front-end process (fabrication process) and a back-end process (assembly process). The front-end process refers to a process of manufacturing semiconductor chips by processing specific patterns by repeatedly performing a procedure of depositing thin films on wafers in various types of process chambers and a procedure of selectively etching the deposited thin films. The back-end process refers to a process of individually separating the chips manufactured in the front-end process and then assembling finished products by combining the chips and lead frames.

In this case, the process of depositing the thin film on the wafer or etching the thin film deposited on the wafer is performed at a high temperature by injecting required process gases such as silane, arsine, boron chloride, hydrogen, nitrogen, and gaseous water, and process gases such as precursor gas required for deposition of the thin film into a process chamber through a gas injection system. In this case, various types of non-deposited reaction by-products, unreacted ignitable gases, and harmful gases containing corrosive foreign substances and toxic substances are produced in large amount in the process chamber.

For this reason, in order to purify and discharge unreacted gases discharged from the process chamber, a semiconductor manufacturing apparatus has a scrubber installed at a rear end of a vacuum pump for creating a vacuum in the process chamber, and the scrubber purifies the unreacted gases discharged from the process chamber and discharges the purified gas into the atmosphere.

However, because the scrubber purifies and processes only gaseous reaction by-products, the reaction by-products contained in the unreacted gases, which are discharged without being used for the deposition in the process chamber, adhere to pipes if particulate reaction by-products containing in the unreacted gases discharged from the process chamber are not trapped in advance. As a result, there is a problem in that an exhaust pressure is increased, the vacuum pump is broken down as the particulate reaction by-products enter the vacuum pump, or the particulate reaction by-products flow back into the process chamber and contaminate wafers.

For this reason, a reaction by-product trapping apparatus, which may have various structures, is installed between the process chamber and the vacuum pump in the semiconductor manufacturing apparatus in order to aggregate the unreacted gases discharged from the process chamber.

However, in the case of the by-product trapping apparatus in the related art, because the reaction by-products contained in the discharged unreacted gases are produced in the form of reaction by-product mixtures when multiple deposition processes for depositing different thin films are performed in the process chamber, temperatures at which the by-products are aggregated are different from one another. For this reason, there is a problem in that it is structurally difficult to efficiently trap the reaction by-products by the single trapping apparatus.

Therefore, trapping apparatuses, which are configured to trap the reaction by-product mixtures in different temperature regions, need to be provided to trap the reaction by-products contained in the unreacted gases. For this reason, there are problems in that an additional trapping apparatus needs to be provided, and a temperature controller is required to adjust and make the trapping temperature region suitable for the reaction by-product to be trapped, which complicates the entire process apparatus and the process control.

Accordingly, there is a need for development of a reaction by-product trapping apparatus capable of solving the above-mentioned problems.

SUMMARY

An object to be achieved by the present disclosure is to provide an apparatus for trapping multiple reaction by-products for a semiconductor process, in which in order to separate, with the single trapping apparatus, reaction by-product mixtures contained in a gas which is discharged after a process of depositing multiple different thin film layers is performed in a process chamber during a semiconductor manufacturing process, a trapping region for the reaction by-products is divided depending on a difference in vertical temperature distribution according to a distance spaced apart from a heater installed at an upper side, residence time is extended by extending flow paths of the unreacted gas and generating vortices by trapping structures provided in multiple stages and having level differences therebetween and by structures having holes having different sizes and arranged differently to trap the respective reaction by-products, such that a reaction by-product, which is aggregated in the form of a thin film in a relatively high-temperature region, is trapped by a first trapping part in an upper region, and a reaction by-product, which is aggregated in the form of powder in a relatively low-temperature region, is trapped by a second trapping part in a lower region.

According to an aspect of the present disclosure, an apparatus for trapping multiple reaction by-products for a semiconductor process is configured to trap a reaction by-product mixture contained in an unreacted gas discharged after multiple thin-film deposition processes are performed in a process chamber during a semiconductor manufacturing process, and the apparatus includes: a first trapping part positioned in an upper region close to a heater installed on a lower portion of an upper plate of a housing and comprising a first trapping structure and a second trapping structure provided in multiple stages in a vertical direction and having structures for extending flow paths and generating vortices to trap a reaction by-product, which reacts at a relatively high temperature, in the form of a thin film from the reaction by-product mixture; and a second trapping part positioned below the first trapping part and comprising a third trapping structure, a fourth trapping structure, a fifth trapping structure, a sixth trapping structure, and a seventh trapping structure provided in multiple stages in the vertical direction and having structures for extending flow paths and generating multiple vortices to trap a reaction by-product, which reacts at a relatively low temperature, in the form of powder from the reaction by-product mixture in a space region maintained at a temperature relatively lower than a temperature of the upper region, in which the reaction by-product mixtures contained in the introduced unreacted gas are trapped in a single apparatus by dividing the region depending on a difference in vertical temperature distribution according to a distance spaced apart from the heater.

According to the present disclosure, the housing may include: a housing main body configured to accommodate the introduced gas; an upper plate having a coolant flow path part and a gas inlet port protruding upward and configured to fix and support a part of the first trapping part and a part of the second trapping part which are positioned below the upper plate and hung on the upper plate; a lower plate having a gas discharge port protruding in both upward and downward directions and having a support portion for fixing the second trapping part; and a discharge port cover installed to be spaced apart from the lower plate at a predetermined interval and configured to guide a flow path of the discharged gas while preventing the reaction by-product from dropping onto the gas discharge port.

According to the present disclosure, the first trapping structure may be configured to trap the reaction by-product by allowing the gas flowing downward from the heater to flow downward through a periphery of the first trapping structure, through a plurality of gas movement holes arranged in a circular shape along the periphery of the first trapping structure, through upper and lower surfaces of the first trapping structure, and through guide-type trapping plates formed on the lower surface of the first trapping structure.

According to the present disclosure, the second trapping structure may be installed such that a circumferential surface thereof is disposed to abut or be adjacent to an inner wall of the housing to prevent the gas, flowing downward from the first trapping structure, from flowing downward along the periphery of the second trapping structure, and the second trapping structure may trap the reaction by-product through upper and lower surfaces of the second trapping structure and through blade-type trapping plates formed on the upper surface of the second trapping structure while switching the flow path to a gas movement hole formed at a central portion thereof and lowering the gas downward.

According to the present disclosure, the plurality of blade-type trapping plates may be radially arranged and installed, and one or more load blades protruding from each of the blade-type trapping plates in a transverse direction has an upper end inclined in a circumferential direction.

According to the present disclosure, the third trapping structure may be configured to trap the reaction by-product by generating vortices with multiple shield-type trapping plate portions, which are disposed such that a level difference therebetween increases in an outward direction, while switching the flow path of the gas flowing downward from the second trapping structure of the first trapping part to the outward direction and lowering the gas through gas movement holes formed along the periphery of the third trapping structure.

According to the present disclosure, the shield-type trapping plate portions may be configured such that a plurality of first trapping pieces having gas movement holes is arranged in a circular shape and disposed at the innermost side so as to face the gas flow, a plurality of second trapping pieces each having a larger size than each of the first trapping pieces and having gas movement holes is arranged in a circular shape and disposed at the outer periphery of the first trapping pieces so as to face the gas flow, and a cylindrical trapping body having a larger size than each of the second trapping pieces and having a plurality of gas movement holes arranged in the surface thereof is disposed at the outer periphery of the second trapping pieces.

According to the present disclosure, the fourth trapping structure may be configured to trap the reaction by-product by generating vortices with multiple shield-type trapping plate portions, which a disposed such that a level difference therebetween increases in a center direction, while switching the flow path of the gas flowing downward from the third trapping structure to the center direction and lowering the gas through a gas movement hole formed at the central portion thereof.

According to the present disclosure, the shield-type trapping plate portions may be configured such that a plurality of first trapping pieces having gas movement holes is arranged in a circular shape and disposed at the outermost side so as to face the gas flow, a plurality of second trapping pieces each having a larger size than each of the first trapping pieces and having gas movement holes is arranged in a circular shape and disposed inside the first trapping pieces so as to face the gas flow, and a cylindrical trapping body having a larger height than each of the second trapping pieces and having a plurality of gas movement holes arranged in the surface thereof is disposed inside the second trapping pieces.

According to the present disclosure, the fifth trapping structure is configured to trap the reaction by-product while switching the flow path of the gas flowing downward from the fourth trapping structure to an outward direction with guide-type trapping plates and lowering the gas.

According to the present disclosure, the guide-type trapping plates may be installed radially, and each have a cross-shaped cross-section to widen a surface area thereof.

According to the present disclosure, the sixth trapping structure may be configured to trap the reaction by-product with blade-type trapping plates while switching the flow path of the gas flowing downward from the fifth trapping structure to a center direction and lowering the gas through a gas movement hole formed at a central portion thereof.

According to the present disclosure, the plurality of blade-type trapping plates may be radially arranged and installed, and one or more load blades protruding from each of the blade-type trapping plates in a transverse direction has an upper end inclined in a circumferential direction.

According to the present disclosure, the seventh trapping structure may be configured to trap the reaction by-product by generating vortices with multiple column-type trapping plate portions, which are disposed such that a level difference therebetween decreases in a center direction, while switching the flow path of the gas flowing downward from the sixth trapping structure to the center direction toward the portion where a discharge port cover is positioned.

According to the present disclosure, the column-type trapping plate portions may be configured such that a plurality of first column-type trapping plates each having a cross-shaped cross-section and having gas movement holes formed on blade surfaces facing the gas flow is arranged in a circular shape at the outermost side, and a plurality of second column-type trapping plates each having a cross-shaped cross-section, having a smaller height than each of the first column-type trapping plates, and having gas movement holes formed on the blade surfaces facing the gas flow is arranged in a circular shape inside the first column-type trapping plates.

The advantage of the apparatus for trapping multiple reaction by-products for a semiconductor process according to the present disclosure having the above-mentioned features is that in order to separate the reaction by-product mixtures contained in the unreacted gas which is discharged after a process of depositing multiple different thin film layers is performed in a process chamber during a semiconductor manufacturing process, the trapping region is divided depending on the difference in vertical temperature distribution according to the distance spaced apart from the heater installed at the upper side, and the residence time is extended by the structures for extending the gas flow paths, guiding the flows, and generating the multiple vortices to trap the respective reaction by-products, such that the reaction by-product, which is aggregated in the form of a thin film in a relatively high-temperature region, is trapped by the first trapping part in the upper region, and the reaction by-product, which is aggregated in the form of powder in a relatively low-temperature region, is trapped by the second trapping part in the lower region, and as a result, the by-product mixtures may be tapped in the single trapping apparatus.

According to the apparatus for trapping multiple reaction by-products according to the present disclosure, the apparatus for a semiconductor manufacturing process and process control are simplified, durability is also improved to the extent that the apparatus can be continuously used for six months or more, and the maintenance cycle for the vacuum pump may be reduced.

The present disclosure is a useful invention having many advantages as described above and is an invention that is highly expected to be used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of an exemplary embodiment of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
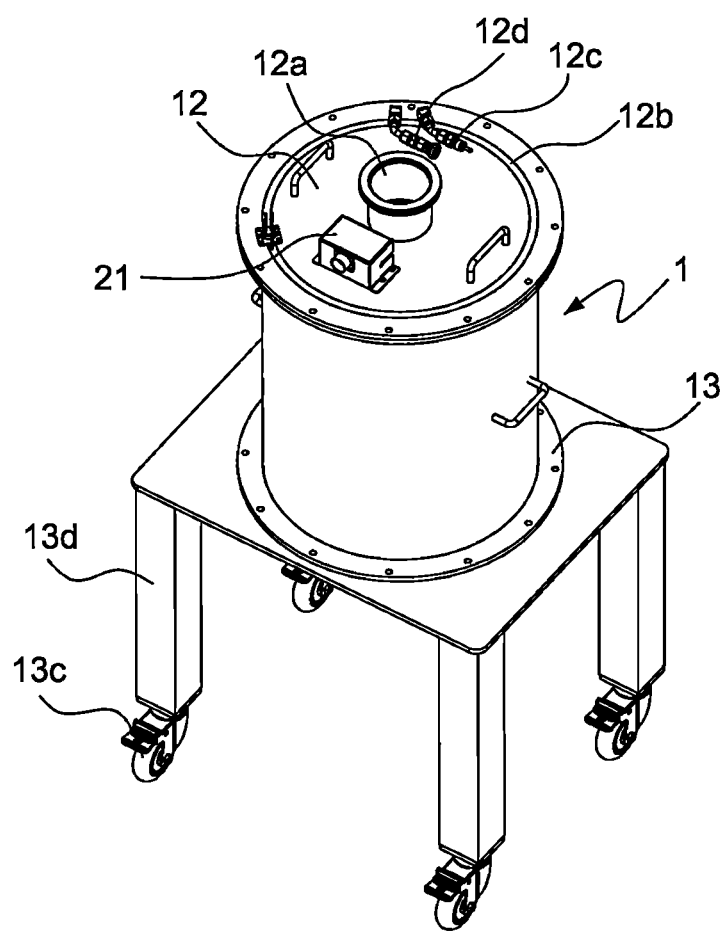
FIG. 1 is a perspective view illustrating a configuration of an apparatus for trapping multiple reaction by-products according to an embodiment of the present disclosure.
Figure 2:
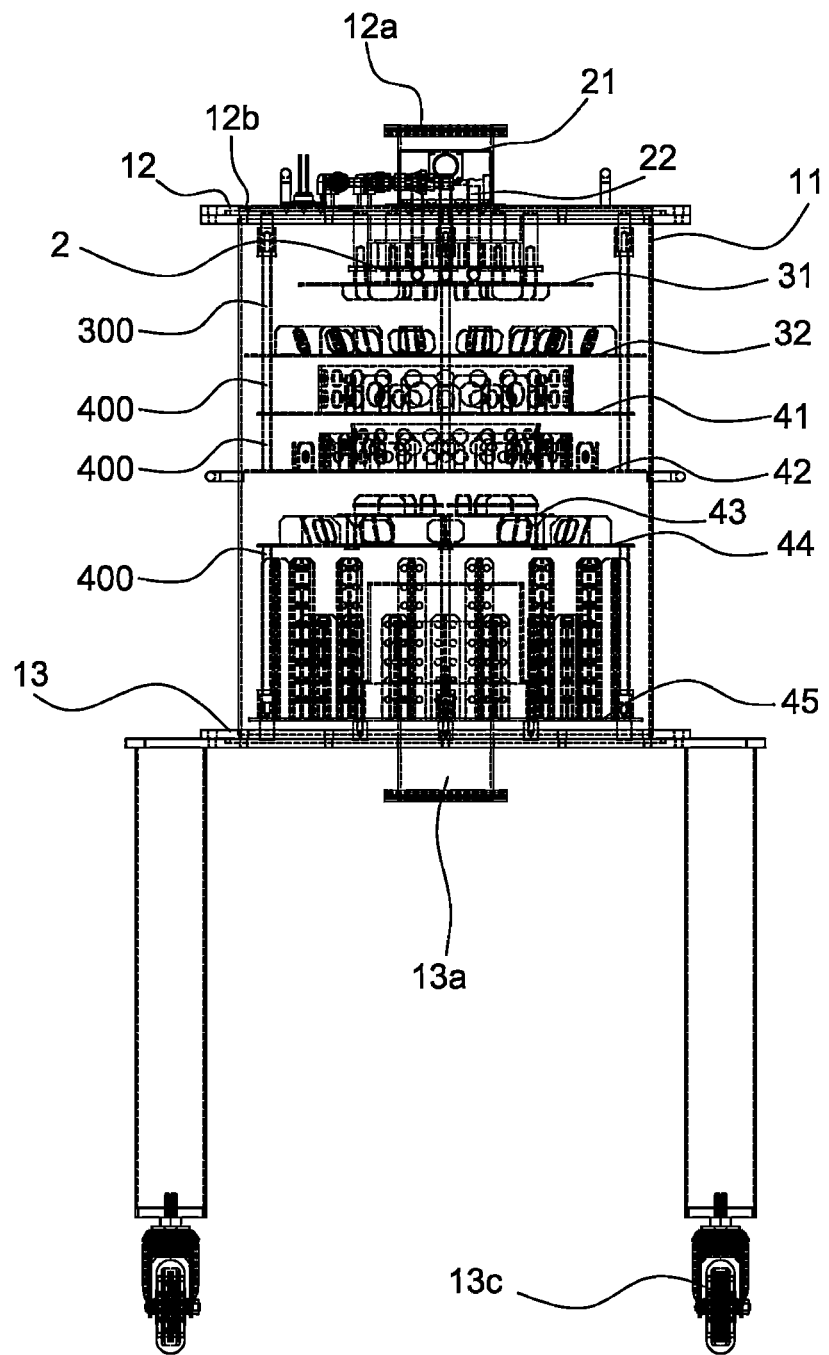
FIG. 2 is a cross-sectional view illustrating an internal configuration of the apparatus for trapping multiple reaction by-products according to the embodiment of the present disclosure.
Figure 3:
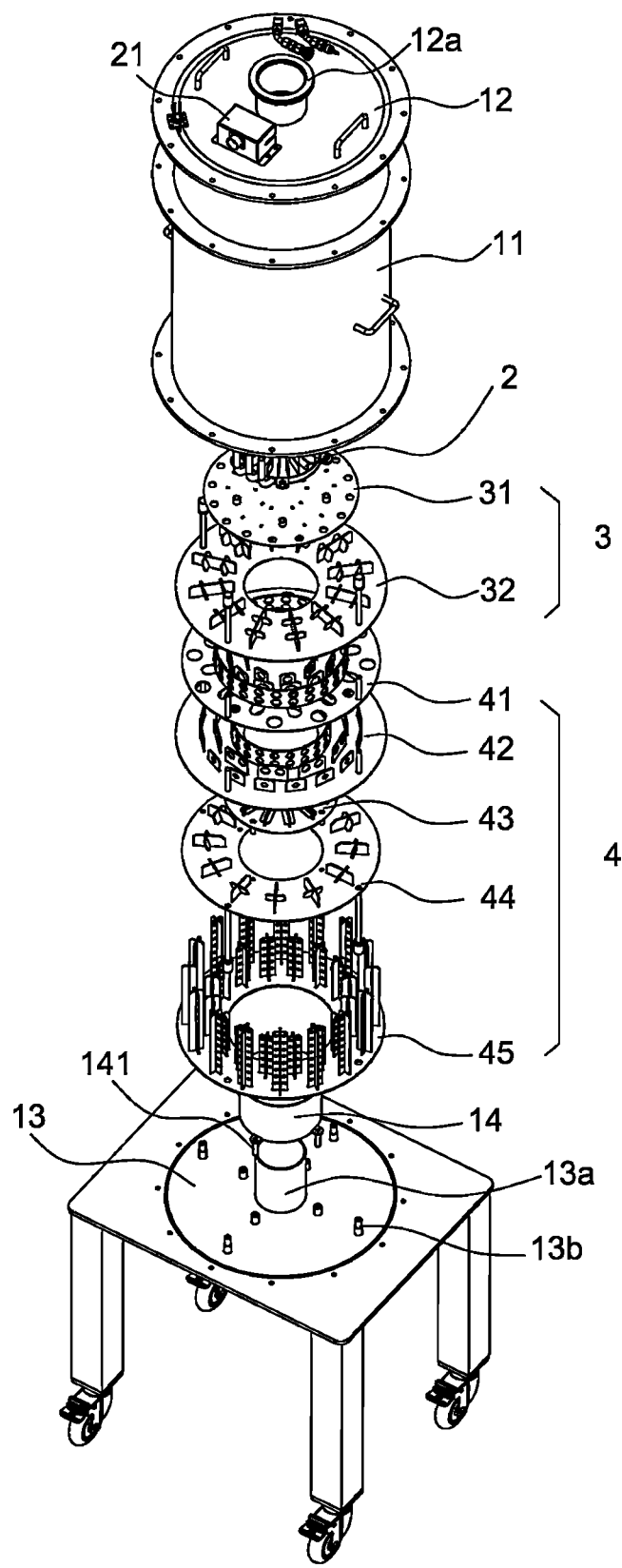
FIG. 3 is an exploded perspective view illustrating a configuration of the apparatus for trapping multiple reaction by-products according to the embodiment of the present disclosure.

FIG. 1 is a perspective view illustrating a configuration of an apparatus for trapping multiple reaction by-products according to an embodiment of the present disclosure, FIG. 2 is a cross-sectional view illustrating an internal configuration of the apparatus for trapping multiple reaction by-products according to the embodiment of the present disclosure, and FIG. 3 is an exploded perspective view illustrating a configuration of the apparatus for trapping multiple reaction by-products according to the embodiment of the present disclosure.

As illustrated, an apparatus for trapping multiple reaction by-products according to the present disclosure refers to an apparatus that separates, depending on temperature regions, reaction by-product mixtures contained in unreacted gases discharged after multiple thin-film deposition processes are performed in a process chamber (not illustrated), traps the reaction by-product mixture in the form of a thin film or powder, and then discharges only the remaining gas (hereinafter, referred to as 'gas') by means of a vacuum pump. The apparatus for trapping multiple reaction by-products broadly includes a housing 1, a heater 2, a first trapping part 3, and a second trapping part 4.

Hereinafter, a high temperature or a low temperature in the present disclosure means a relative temperature according to trapping temperatures for reaction by-product mixtures having different aggregation temperatures. The high temperature refers to a temperature of 150° C. or more, and the low temperature refers to a temperature of 150° C. or less.

The housing 1 has a vertical shape so that the gas discharged from the process chamber is introduced through an upper portion of the housing, accommodated in the housing, and then discharged through a lower portion of the housing.

The heater 2 is configured to heat the introduced unreacted gas.

The first trapping part 3 is positioned in an upper region in the housing 1 in which the heater 2 is installed. The first trapping part 3 is configured to trap the reaction by-product, which is aggregated in the form of a thin film by reacting at a high temperature, from the reaction by-product mixtures contained in the introduced gas in a space region maintained at a temperature relatively higher than a lower region distant from the heater 2.

The second trapping part 4 is positioned in the lower region of the housing 1 and disposed at a position relatively farther in distance from the heater 2 than is the first trapping part 3. The second trapping part 4 is configured to trap the reaction by-product, which is aggregated in the form of powder by reacting at a low temperature, from the reaction by-product mixtures contained in the introduced gas in a space region maintained at a temperature relatively lower than the upper region of the housing.

Most of the respective components may be manufactured using a material such as stainless steel or aluminum that may prevent the components from being corroded by the gas discharged from the process chamber.

The reaction by-product mixtures contained in the gas, which are trapped by the apparatus for trapping multiple reaction by-products according to the embodiment of the present disclosure described above, will be described. The reaction by-product mixtures contained in the gas, which is discharged after an oxide deposition process, i.e., a repetitive thin-film deposition process using $Al_2O_3$ and SrO is performed in a process chamber for manufacturing a semiconductor, may include an $Al_2O_3$ reaction by-product and a SrO reaction by-product.

Therefore, the apparatus for trapping multiple reaction by-products requires a configuration that aggregates the reaction by-product mixtures containing $Al_2O_3$ and SrO contained in the gas by using the single trapping apparatus and forms the reaction by-product mixture in the form of a thin film or powder.

To this end, a difference in vertical temperature distribution according to the distance spaced apart from the heater is used to separate the reaction by-product mixtures containing $Al_2O_3$ and SrO, which are aggregated and trapped in different temperature regions, into trapping spaces in which the reaction by-products are aggregated in the form of a thin film and powder. The trapping regions are separated such that the $Al_2O_3$ reaction by-product is trapped in the form of a thin film in the first trapping part 3 which is the upper high-temperature region in which a high temperature is provided by the heater, and the SrO reaction by-product is trapped in the form of powder in the second trapping part 4 which is the lower low-temperature region, thereby simultaneously trapping $Al_2O_3$ and SrO in the single trapping apparatus.

Hereinafter, the respective components will be described more specifically.

Figure 4:
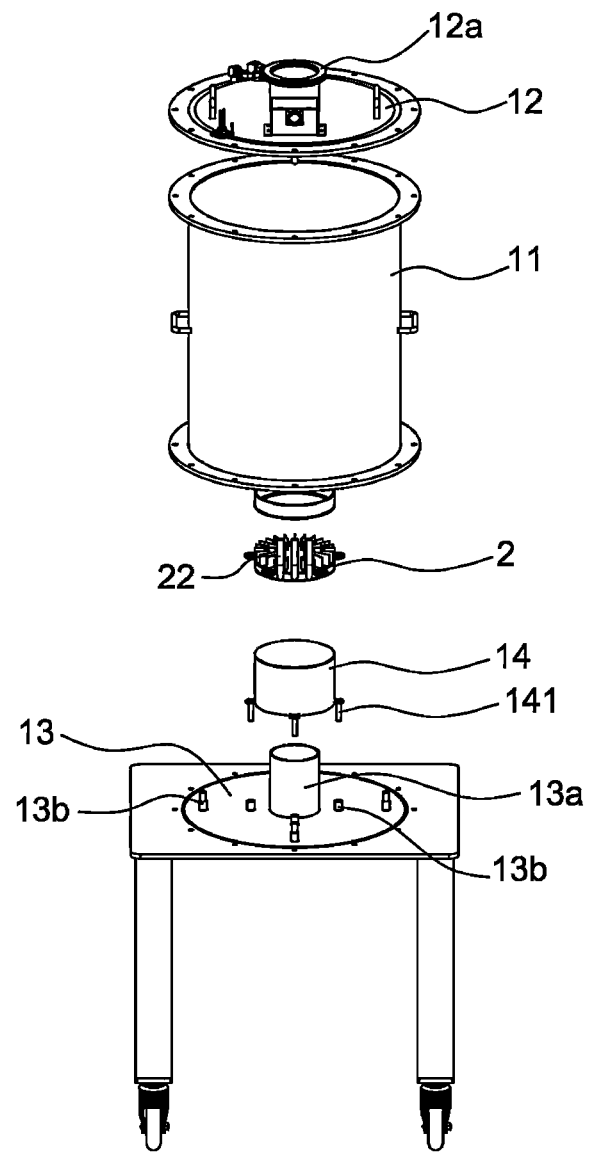
FIG. 4 is a perspective view illustrating configurations of a housing and a heater according to the embodiment of the present disclosure.

FIG. 4 is a perspective view illustrating configurations of the housing and the heater according to the embodiment of the present disclosure.

As illustrated, the housing 1 includes: a housing main body 11 configured to accommodate the introduced gas; an upper plate 12 having a coolant flow path part 12b and a gas inlet port 12a protruding upward; a lower plate 13 having a gas discharge port 13a protruding in both upward and downward directions; and a discharge port cover 14 installed to be spaced apart from the lower plate at a predetermined interval and configured to guide a flow path of the discharged gas while preventing the reaction by-product from dropping onto the gas discharge port 13a.

In addition, the heater 2 is installed on a lower portion of the upper plate and provides a heat source to a lower side in a vertical direction to heat the introduced unreacted gas and adjust a temperature of the unreacted gas.

Hereinafter, according to the embodiment of the present disclosure, the housing main body 11, the upper plate 12, and the lower plate 13 are illustrated as each having a cylindrical structure elongated in the vertical direction, but the present disclosure is not limited by the above-mentioned shape of the housing, and a necessary shape such as a quadrangular column shape or a polygonal column shape may of course be applied. However, for convenience of description, the present disclosure will be described with reference to the configuration in which the housing main body 11, the upper plate 12, and the lower plate 13 each have a cylindrical structure.

The housing main body 11 has a vacant housing shape and serves to store the introduced gas so that the reaction by-product mixture contained in the gas introduced into the first trapping part 3 and the second trapping part 4 installed in the housing main body in the vertical direction is aggregated and trapped in the form of a thin film or powder.

The upper plate 12 is installed on an upper portion of the housing main body 11 and serves as a cover for covering an opened upper side of the housing main body 11. The upper plate 12 serves to introduce the gas through the gas inlet port 12a protruding from the upper portion of the upper plate. The gas introduced into the housing flows while passing through the first trapping part and the second trapping part and then is discharged through the gas discharge port 13a provided on the lower plate 13.

In addition, the upper plate serves to fix and support a part of the first trapping part 3 and a part of the second trapping part 4 which are positioned and hung on the upper plate below the upper plate.

In addition, the coolant flow path part 12b is processed in the form of a groove in an upper surface of the upper plate 12 in order to adjust a surface temperature of the housing main body outer and prevent deformation of a non-illustrated O-ring installed on the lower portion of the upper plate when an internal space of the housing main body 11 is heated. An upper portion of the coolant flow path part is blocked and sealed by a flow path cover so as to have water tightness.

In addition, a power supply part 21 for supplying power to the heater 2 is installed at one upper point of the upper plate 12 to control a temperature while supplying power through a power tube 22.

The coolant flow path part 12b is provided on the upper plate 12 and includes a coolant inlet port 12c and a coolant discharge port 12d to circulate, supply, and discharge the coolant, which is supplied from an external coolant tank (not illustrated), through the coolant flow path formed on the upper plate.

In addition, the coolant flow path part 12*b* formed on the upper plate has a boundary portion that prevents the coolant, which is introduced through the coolant inlet port and then is to be discharged through the coolant discharge port, from being mixed with the introduced coolant. Water or a refrigerant may be used as the coolant used for the coolant flow path part.

The lower plate 13 serves as a cover for covering an opened lower side of the housing main body 11 and to discharge the gas, from which the reaction by-product mixture is trapped, toward the vacuum pump through the gas discharge port 13*a*.

In addition, the lower plate 13 has support portions 13*b* provided on an upper surface thereof to fix fixing members 400 of the second trapping part 4 positioned on the upper portion of the lower plate. The fixing member may be thread-fastened to the support portion 13*b* by inserting a fastening rod having a separate screw thread into the vacant fixing member. Various well-known fastening methods such as a fitting method or a welding method may of course be applied as an example of the fastening method.

In addition, mobile wheels 13*c* are installed on supports 13*d* having a predetermined length and installed on the lower plate, such that the trapping apparatus may be conveniently moved to a necessary position. Of course, the lower plate may be fixed to a frame or a floor surface in a factory, such that the lower plate may be configured as a stationary lower plate.

The discharge port cover 14 is configured to protect the upper portion of the gas discharge port 13*a* in order to prevent the reaction by-product from dropping directly downward through the upper portion of the gas discharge port 13*a* protruding upward and downward by penetrating the lower plate 13.

To this end, the discharge port cover 14 has a cylindrical structure having a closed upper side and an opened lower side. A plurality of spacing members 141 is provided on the lower portion of the discharge port cover 14 and installed to be spaced apart from the upper surface of the lower plate and the upper end of the gas discharge port 13*a* at a predetermined interval.

With the above-mentioned configuration, the gas, from which the reaction by-product is removed, flows downward through the lower end of the second trapping part, flows to the lower end of the discharge port cover 14 along the periphery of the discharge port cover 14, and then flows into the discharge port cover 14 from the point at which the spacing members 141 are provided. Thereafter, the gas flows upward as the flow path is switched to the upward direction along a space between an inner surface of the discharge port cover 14 and an outer surface of the gas discharge port 13*a* protruding from the upper portion of the lower plate.

Thereafter, when the gas flows upward to the upper surface of the discharge port cover 14 and the flow path is blocked, the flow path is switched again, such that the gas flows downward along the inside of the gas discharge port 13*a* through an upper opening of the gas discharge port 13*a* and then is discharged to the outside through the gas discharge port 13*a* protruding from the lower portion of the lower plate.

The heater 2 generates heat by being supplied with power from the power supply part 21, and a diffuser structure (diffusion structure) provided on the upper portion of the heater diffuses the gas, which is introduced through the gas inlet port 12*a* installed on the upper plate, while heating the gas. The heater 2 is attached to and installed on the upper plate by a fastening method such as bolting or welding. A material such as ceramic or Inconel may be used as the material of the heater 2 in order to prevent corrosion caused by the introduced gas.

When the heater 2 configured as described above operates, the gas discharged from the process chamber is heated so that the reaction by-product is not aggregated when the gas is introduced into the housing main body through the gas inlet port 12*a*.

As described above, when the gas heated by the heater reaches the first trapping part 3, the solid reaction by-product, which is aggregated by reacting at a relatively high temperature, is trapped in the form of a thin film from the reaction by-product mixtures contained in the gas. Thereafter, when the gas, which has a temperature that is lowered as the gas flows away from the heater 2 in the vertical direction, reaches the second trapping part 4, the solid reaction by-product, which is aggregated by reacting at a relatively low temperature, is trapped in the form of powder from the reaction by-product mixtures contained in the gas.

Figure 5:
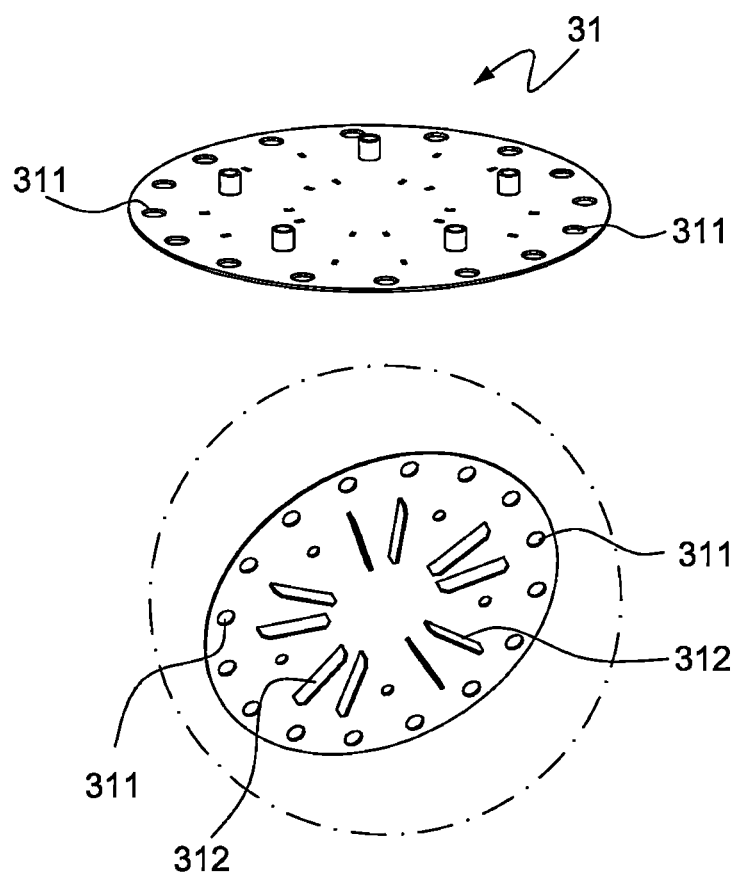
FIG. 5 is an exemplified view illustrating a configuration of a first trapping structure of a first trapping part according to the embodiment of the present disclosure.
Figure 6:
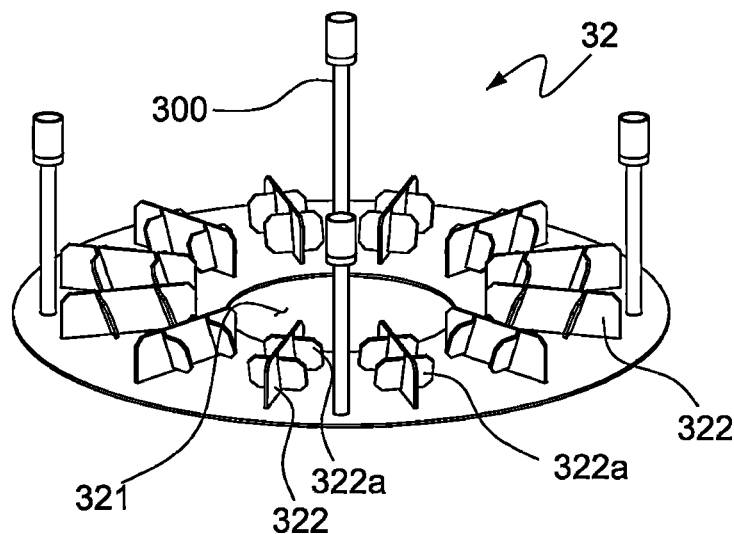
FIG. 6 is an exemplified view illustrating a configuration of a second trapping structure of the first trapping part according to the embodiment of the present disclosure.

FIG. 5 is an exemplified view illustrating a configuration of the first trapping structure of a first trapping part according to the embodiment of the present disclosure, and FIG. 6 is an exemplified view illustrating a configuration of a second trapping structure of the first trapping part according to the embodiment of the present disclosure.

Hereinafter, for convenience of description, in the embodiment, basic structures of the first trapping structure and the second trapping structure are illustrated as each having a circular plate shape in accordance with the shape of the housing. However, the basic structure of the trapping structure positioned in the housing may have a quadrangular or polygonal shape in accordance with the shape of the housing.

As illustrated, the first trapping part 3 is positioned at a lower side adjacent to the heater 2 and extends the gas flow path to delay the flow of the gas and trap the reaction by-product. The first trapping part 3 is positioned in the upper region among the regions of the present disclosure made by dividing the trapping region for the reaction by-product mixtures depending on the temperature because of a short spacing distance.

The first trapping part 3 includes a first trapping structure 31 and a second trapping structure 32 provided in multiple stages in the vertical direction in order to extend the flow path and generate vortices to trap the reaction by-product in the form of a thin film in the high-temperature region from the reaction by-product mixtures contained in the gas while switching and guiding the flow of the gas with a raised temperature to an outward direction or a direction toward the central portion.

The first trapping part 3 according to the embodiment of the present disclosure includes the first trapping structure 31 and the second trapping structure 32 and traps the reaction by-product in a high temperature state while switching the flow of the gas along the structure for extending the flow path. The first trapping structure 31 has a circular plate shape and traps the reaction by-product by allowing the gas flowing downward from the heater to flow downward through the periphery of the first trapping structure 31, through a plurality of gas movement holes 311 arranged in a circular shape along the periphery of the first trapping structure 31, through the upper and lower surfaces of the first trapping structure 31, and through guide-type trapping plates 312 formed on the lower surface of the first trapping structure 31. The second trapping structure 32 is installed such that a circumferential surface thereof is disposed to abut or be adjacent to the inner wall of the housing to prevent the gas, flowing downward from the first trapping structure 31, from flowing downward along the periphery of the second trapping structure 32. The second trapping structure 32 has a circular plate shape and traps the reaction by-product through the upper and lower surfaces of the second trapping structure 32 and through blade-type trapping plates 322 formed on the upper surface of the second trapping structure 32 while switching the flow path to a gas movement hole 321 formed at a central portion thereof and lowering the gas downward.

The second trapping structure 32 has a relatively larger size than the first trapping structure 31. To this end, an outer diameter of the first trapping structure 31 is smaller than an inner diameter of the housing main body 11, and an outer diameter of the second trapping structure 32 is similar to the inner diameter of the housing main body 11, thereby implementing a structure in which the introduced gas is difficult to flow downward along the periphery thereof.

With the above-mentioned configuration, the introduced gas flows downward through the gas movement holes 311 formed along the outer portion and the periphery of the first trapping structure 31 and then flows downward after passing through the gas movement hole 321 formed at the central portion of the second trapping structure 32. Therefore, the flow path and the residence time are extended, and a larger amount of reaction time is provided, such that the reaction by-product is trapped in the form of a thin film on the surfaces thereof.

The first trapping structure 31 has the plurality of guide-type trapping plates 312 installed and arranged radially on the lower surface thereof in order to trap a larger number of reaction by-products. The reason why no trapping plate is installed on the upper surface of the first trapping structure is not to hinder the flow of the gas, if possible, thereby trapping the reaction by-product evenly in the form of a thin film in the first trapping part in the state in which a high temperature of the gas is maintained.

The guide-type trapping plate 312 of the first trapping structure 31 has a flat plate structure and is configured such that a longitudinal direction thereof is directed toward the central portion thereof in order to quickly guide the gas to the central portion without hindering the flow of the gas when trapping the reaction by-product.

The second trapping structure 32 has the plurality of blade-type trapping plates 322 installed and arranged radially on the upper surface in order to trap a large number of reaction by-products. One or more load blades 322a protrude from the blade-type trapping plate 322 in a transverse direction to maximally improve the trapping efficiency before the gas is discharged while quickly flowing to the gas movement hole 321 when trapping the reaction by-product.

The above-mentioned structure provides a load against the flow of the introduced gas and extends the residence time while generating the vortices, thereby providing enough time to trap the reaction by-product in the form of a thin film. In addition, the load blade 322a may be installed at an angle inclined to the direction in which the gas is introduced, i.e., an upper end of the load blade 322a may be inclined in a circumferential direction of the second trapping structure, thereby generating a larger number of vortices.

In addition, the second trapping structure 32 may be positioned in the same space portion as the guide-type trapping plates 312 installed on the lower surface of the first trapping structure 31 positioned above the second trapping structure 32, thereby improving the trapping efficiency.

The first trapping structure 31 constituting the first trapping part 3 may be thread-fastened to the heater by inserting fastening rods into vacant fixing members 300, and the second trapping structure 32 may be fastened to the upper plate by inserting the fastening rods into the vacant fixing members 300. Various well-known fastening methods such as a fitting method or a welding method may of course be applied as an example of the fastening method.

The first trapping part 3 configured as described above is positioned in the upper region of the housing in which the heater 2 is installed. The first trapping part 3 traps the reaction by-product, which is aggregated in the form of a thin film by reacting at a high temperature, from the reaction by-product mixtures contained in the gas while guiding the flow of the gas, which is introduced from the space region maintained at a temperature relatively higher than a temperature of the lower region, downward to the outward direction using the first trapping structure 31 and the second trapping structure 32, guiding the gas flow to the central portion again, and then lowering the gas flow downward.

Figure 7:
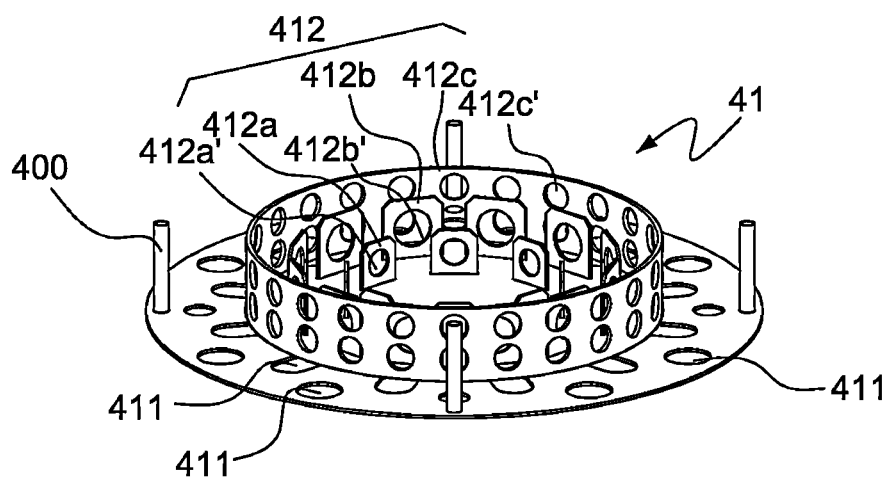
FIG. 7 is an exemplified view illustrating a configuration of a third trapping structure of a second trapping part according to the embodiment of the present disclosure.
Figure 8:
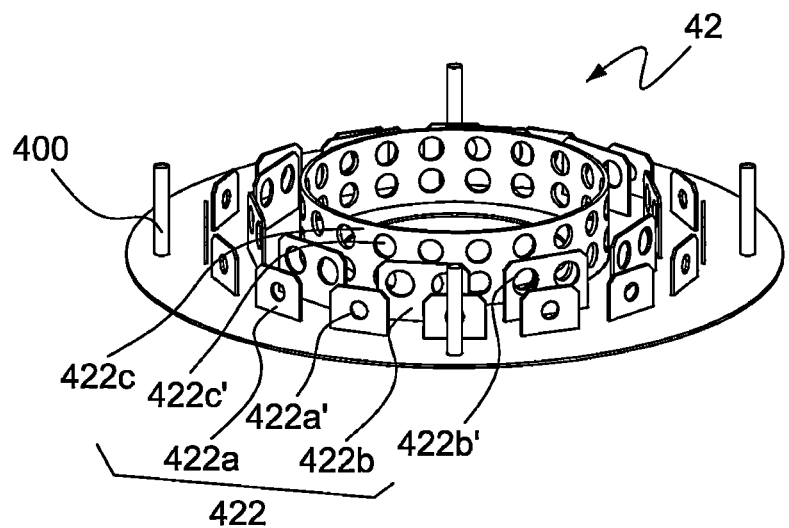
FIG. 8 is an exemplified view illustrating a configuration of a fourth trapping structure of the second trapping part according to the embodiment of the present disclosure.
Figure 9:
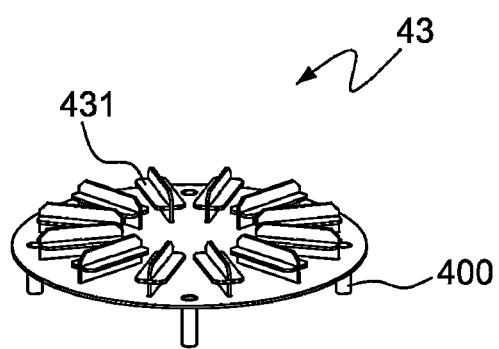
FIG. 9 is an exemplified view illustrating a configuration of a fifth trapping structure of the second trapping part according to the embodiment of the present disclosure.
Figure 10:
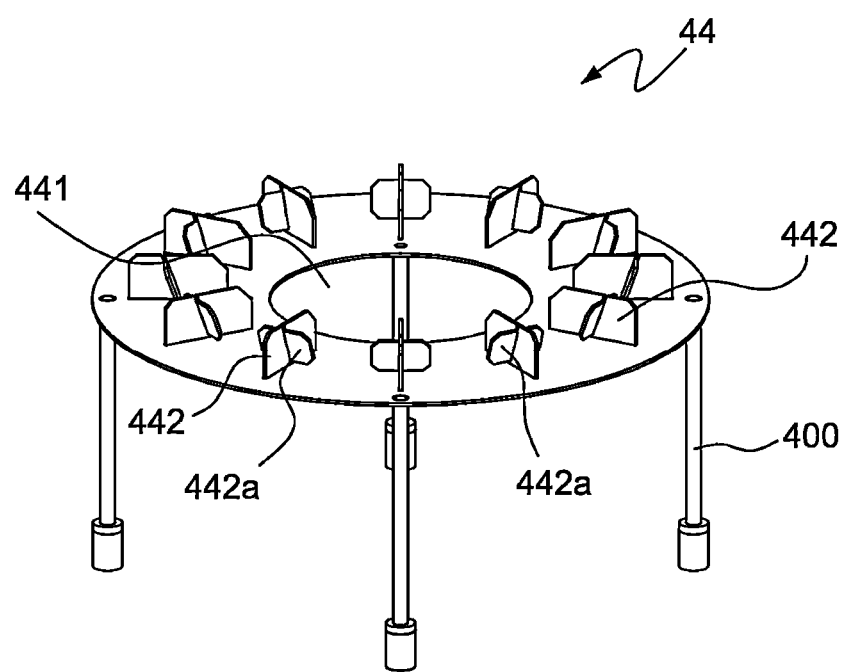
FIG. 10 is an exemplified view illustrating a configuration of a sixth trapping structure of the second trapping part according to the embodiment of the present disclosure.
Figure 11:
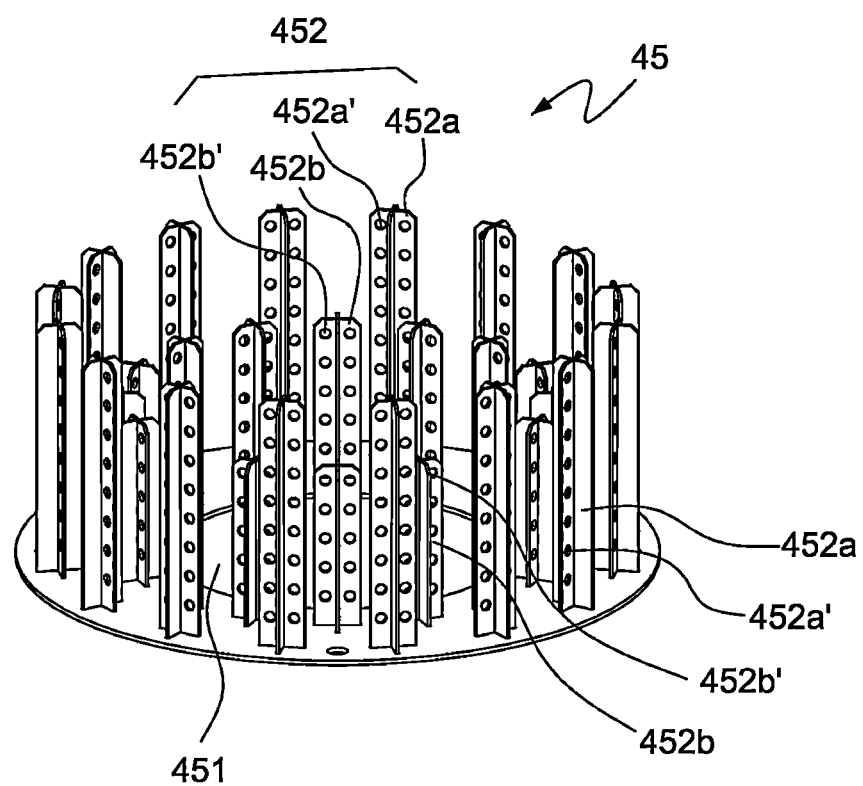
FIG. 11 is an exemplified view illustrating a configuration of a seventh trapping structure of the second trapping part according to the embodiment of the present disclosure.

FIG. 7 is an exemplified view illustrating a configuration of a third trapping structure of the second trapping part according to the embodiment of the present disclosure, FIG. 8 is an exemplified view illustrating a configuration of a fourth trapping structure of the second trapping part according to the embodiment of the present disclosure, FIG. 9 is an exemplified view illustrating a configuration of a fifth trapping structure of the second trapping part according to the embodiment of the present disclosure, FIG. 10 is an exemplified view illustrating a configuration of a sixth trapping structure of the second trapping part according to the embodiment of the present disclosure, and FIG. 11 is an exemplified view illustrating a configuration of a seventh trapping structure of the second trapping part according to the embodiment of the present disclosure.

Hereinafter, for convenience of description, in the embodiment, basic structures of the third trapping structure and the fourth trapping structure are illustrated as each having a circular plate shape in accordance with the shape of the housing. However, the basic structure of the trapping structure positioned in the housing may have a quadrangular or polygonal shape in accordance with the shape of the housing.

As illustrated, the second trapping part 4 is positioned vertically below the first trapping part 3 disposed adjacent to the heater 2. For this reason, the second trapping part 4 is farther in distance from the heater 2 than is the first trapping part 3, and the second trapping part 4 is not additionally heated, such that a relatively low-temperature gas is introduced into the second trapping part 4. Therefore, the second trapping part 4 is positioned in the lower region among the regions of the present disclosure made by dividing the trapping region for the reaction by-product mixtures depending on the temperature.

The second trapping part 4 includes a third trapping structure 41, a fourth trapping structure 42, a fifth trapping structure 43, a sixth trapping structure 44, and a seventh trapping structure 45 provided in multiple stages in the vertical direction in order to extend the flow path and generate multiple vortices to trap the reaction by-product, which is aggregated in the form of powder under a relatively low-temperature condition, from the reaction by-product mixtures contained in the gas has a temperature that is lowered as the gas passes through the first trapping part 3.

The second trapping part 4 according to the embodiment of the present disclosure includes the third trapping structure 41, the fourth trapping structure 42, the fifth trapping structure 43, the sixth trapping structure 44, and the seventh trapping structure 45. The third trapping structure 41 traps the reaction by-product by generating vortices with multiple shield-type trapping plate portions 412, which are disposed such that a level difference therebetween increases in the outward direction, while switching the flow path of the gas flowing downward from the second trapping structure 32 of the first trapping part to the outward direction and lowering the gas through gas movement holes 411 formed along the periphery of the third trapping structure 41. The fourth trapping structure 42 traps the reaction by-product by generating vortices with multiple shield-type trapping plate portions 422, which a disposed such that a level difference therebetween increases in the center direction, while switching the flow path of the gas flowing downward from the third trapping structure 41 to the center direction and lowering the gas through a gas movement hole 421 formed at the central portion thereof. The fifth trapping structure 43 traps the reaction by-product while switching the flow path of the gas flowing downward from the fourth trapping structure 42 to the outward direction with guide-type trapping plates 431 and lowering the gas. The sixth trapping structure 44 traps the reaction by-product with blade-type trapping plates 442 while switching the flow path of the gas flowing downward from the fifth trapping structure 43 to the center direction and lowering the gas through a gas movement hole 441 formed at the central portion thereof. The seventh trapping structure 45 traps the reaction by-product by generating vortices with multiple column-type trapping plate portions 452, which are disposed such that a level difference therebetween decreases in the center direction, while switching the flow path of the gas flowing downward from the sixth trapping structure 44 to the center direction toward the portion where the discharge port cover 14 is positioned. Therefore, the second trapping part 4 traps the reaction by-products in the form of powder in a low temperature state by delaying the gas flow and generating multiple vortices with the vortex generating structures implemented by the shield-type trapping plate portions, the guide-type trapping plates, the blade-type trapping plates, and the column-type trapping plate portions installed to face the gas flow while changing the level differences therebetween and switching the gas flow along the structures for extending the flow paths.

The third to seventh trapping structures 41, 42, 43, 44, and 45 will be described more specifically.

In the embodiment, the third trapping structure 41 is configured as a trapping plate having a circular plate shape. The third trapping structure 41 is configured to switch the flow path of the gas flowing downward from the first trapping part to the outward direction, guide the gas in the outward direction, and lower the gas through the plurality of gas movement holes 411 formed along the periphery thereof. In this case gas, the movement holes 411 may be arranged in multiple stages in two ways. The gas movement holes 411 arranged in a circular shape along the outermost periphery may be circular holes, and the gas movement holes 411 arranged in a circular shape inside the circular holes may be long holes. The present disclosure is not limited by the shape and arrangement, and it is acceptable as long as a larger number of gas movement holes are alternately arranged in a circular shape to uniformly discharge the gas.

Meanwhile, the multiple shield-type trapping plate portions 412 installed on the upper surface of the third trapping structure 41 are disposed such that the level difference therebetween increases in the outward direction in order to trap the reaction by-product with high efficiency while generating the vortices.

In the embodiment, a plurality of first trapping pieces 412a having one or more gas movement holes 412a' formed in the surfaces thereof is arranged in a circular shape and disposed at the innermost side so as to face the flow of the gas flowing in the outward direction, a plurality of second trapping pieces 412b each having a larger height and width than each of the first trapping pieces and having one or more gas movement holes 412b' formed in the surfaces thereof is arranged in a circular shape and disposed at the outer periphery of the first trapping pieces so as to face the gas flow, and a cylindrical trapping body 412c having a larger height than each of the second trapping pieces and having a plurality of gas movement holes 412c' arranged and formed in the surface thereof is disposed at the outer periphery of the second trapping pieces so as to face the gas flow.

In the embodiment, the first trapping pieces and the second trapping piece may be installed alternately and arranged in a circular shape. With the above-mentioned configuration, the gas passing through the gas movement holes of the first trapping pieces may flow directly to the gas movement holes of the second trapping pieces or directly to the cylindrical trapping body, which improves the efficiency in forming the vortices using a difference in flow velocity.

In addition, in the embodiment, the gas movement hole of the second trapping piece positioned between the first trapping piece and the cylindrical trapping body has the largest size. With the above-mentioned configuration, there occurs a difference in amount of the gas passing through the gas movement holes, which improves the efficiency in forming the vortices using a difference in flow velocity.

As described above, in the case in which the shield-type trapping plate portions 412 are structured such that the sizes of the gas movement holes are different from one another and a level difference therebetween varies such that the heights of the shield-type trapping plate portions 412 increase outward toward the cylindrical trapping body 412c, the flow of the gas is blocked by the height while the gas flows in a zigzag direction and in the outward direction from the central portion, which delays the gas flow in the internal space. Further, the efficiency in forming the vortices using the difference in flow velocity is improved by the differences in heights, arrangements, and sizes of the gas movement holes.

In the embodiment, the fourth trapping structure 42 is configured as a trapping plate having a circular plate shape. The fourth trapping structure 42 is configured to switch the flow path of the gas flowing downward from the third trapping structure 41 to the center direction and lower the gas through the gas movement hole 421 formed at the central portion thereof.

Meanwhile, the multiple shield-type trapping plate portions 422 installed on the upper surface of the fourth trapping structure 42 are disposed such that the level difference therebetween increases in the center direction in order to trap the reaction by-product with high efficiency while generating the vortices. The fourth trapping structure 42 has an opposite shape to the third trapping structure 41.

In the embodiment, a plurality of first trapping pieces 422a having one or more gas movement holes 422a' formed in the surfaces thereof is arranged in a circular shape and disposed at the outermost side so as to face the flow of the gas flowing in the direction toward the central portion thereof, a plurality of second trapping pieces 422b each having a larger height and width than each of the first trapping pieces and having one or more gas movement holes 422b' formed in the surfaces thereof is arranged in a circular shape and disposed inside the first trapping pieces 422a so as to face the gas flow, and a cylindrical trapping body 422c having a larger height than each of the second trapping pieces and having a plurality of gas movement holes 422c' arranged and formed in the surface thereof is disposed inside the second trapping pieces so as to face the gas flow.

In the embodiment, the first trapping pieces and the second trapping piece may be installed alternately and arranged in a circular shape. With the above-mentioned configuration, the gas passing through the gas movement holes of the first trapping pieces may flow directly to the gas movement holes of the second trapping pieces or directly to the cylindrical trapping body, which improves the efficiency in forming the vortices using a difference in flow velocity.

In addition, in the embodiment, the gas movement hole of the second trapping piece positioned between the first trapping piece and the cylindrical trapping body has the largest size. With the above-mentioned configuration, there occurs a difference in amount of the gas passing through the gas movement holes, which improves the efficiency in forming the vortices using a difference in flow velocity.

As described above, in the case in which the shield-type trapping plate portions 422 are structured such that the sizes of the gas movement holes are different from one another and a level difference therebetween varies such that the heights of the shield-type trapping plate portions 422 increases toward the cylindrical trapping body 422c at the central portion, the flow of the gas is blocked by the height and the gas cannot easily flow to the gas movement hole 421 formed at the central portion while the gas flows in a zigzag direction and in the direction from the outer portion to the central portion, which delays the gas flow in the internal space. Further, the efficiency in forming the vortices using the difference in flow velocity is improved by the differences in heights, arrangements, and sizes of the gas movement holes.

In the embodiment, the fifth trapping structure 43 is configured as a trapping plate having a circular plate shape. The fifth trapping structure 43 is configured to switch the flow path of the gas flowing downward from the fourth trapping structure 42 to the outward direction by using the guide-type trapping plates 431 installed radially and each having a cross-shaped cross-section, trap the reaction by-product, and then lower the gas outward.

The reason why the guide-type trapping plate 431 having a cross-shaped cross-section is installed as described above is to widen a surface area to trap a larger number of reaction by-products and stably guide the gas flow.

In addition, the fifth trapping structure 43 has a relatively smaller size than the fourth trapping structure 42, positioned above the fifth trapping structure 43, and the sixth trapping structure 44 positioned below the fifth trapping structure 43, thereby guiding the gas flow such that the gas flowing downward from the fourth trapping structure 42 reaches the peripheral region of the sixth trapping structure 44.

In particular, the fifth trapping structure 43 and the sixth trapping structure 44 are installed to be nearly adjacent to each other, such that the gas flowing in the outward direction from the fifth trapping structure 43 more quickly reaches the peripheral region of the sixth trapping structure 44.

The fifth trapping structure 43 is fastened and fixed to the sixth trapping structure 44 positioned below the fifth trapping structure 43 by means of fixing members 400.

In the embodiment, the sixth trapping structure 44 is configured as a trapping plate having a circular plate shape. The fifth trapping structure 43 having a relatively small size is positioned above the central portion of the sixth trapping structure 44, and the sixth trapping structure 44 is configured to switch the flow path of the gas flowing downward from the periphery of the fifth trapping structure 43 to the center direction and lower the gas through the gas movement hole 441.

Meanwhile, the blade-type trapping plates 442, which are installed and arranged radially on the upper surface of the sixth trapping structure 44 in order to generate vortices and trap the reaction by-product with high efficiency, each have one or more load blades 442a protruding in the transverse direction in order to maximally improve the efficiency in trapping reaction by-product before the gas is discharged while quickly flowing to the gas movement hole 441.

The above-mentioned structure provides a load against the flow of the introduced gas and extends the residence time while generating the vortices, thereby providing enough time to trap the reaction by-product in the form of powder. In addition, the load blade 442a may be installed at an angle inclined to the direction in which the gas is introduced, i.e., an upper end of the load blade 442a may be inclined in a circumferential direction of the sixth trapping structure, thereby generating a larger number of vortices.

In the embodiment, the seventh trapping structure 45 is configured as a trapping plate having a circular plate shape. A hole 451 is formed at the central portion of the seventh trapping structure 45 so that the discharge port cover 14 for protecting the periphery of the gas discharge port 13a is installed in the hole 451.

Meanwhile, the multiple column-type trapping plate portions 452 installed and arranged radially on the upper surface of the seventh trapping structure 45 are disposed such that the level difference therebetween decreases in the center direction in order to trap the reaction by-product with high efficiency while generating the vortices.

In the embodiment, a plurality of first column-type trapping plates 452a each having a cross-shaped cross-section and having gas movement holes 452a' formed on the blade surfaces facing the gas flow is arranged in a circular shape at the outermost side, and a plurality of second column-type trapping plates 452b each having a cross-shaped cross-section, having a smaller height than each of the first column-type trapping plates 452a, and having gas movement holes 452b' formed on the blade surfaces facing the gas flow is arranged in a circular shape inside the first column-type trapping plates 452a.

As described above, in the case in which the column-type trapping plate portions 452 are structured such that the level difference therebetween varies such that the heights of the column-type trapping plate portions 452 decrease inward, the lowered gas stagnates and remains in the seventh trapping structure, such that the trapping efficiency is improved, and the discharge flow of the gas is not hindered.

If the column-type trapping plate portions 452 are installed such that the level difference therebetween varies in a direction opposite to the above-mentioned direction, the gas flows to the gas discharge port 13a without passing through the trapping plate portions disposed at the outer side, which reduces the stagnation of the gas and the generation of the vortex and thus degrades the trapping efficiency.

The third trapping structure 41 and the fourth trapping structure 42, which constitute the second trapping part 4, are fastened to the upper plate by inserting the fastening rods into the vacant fixing members 400. The fifth to seventh trapping structures 43, 44, and 45 may be fastened to the support portions of the lower plate by inserting the fastening rods into the vacant fixing members 400. Various well-known fastening methods such as a fitting method or a welding method may of course be applied as an example of the fastening method.

The second trapping part 4 configured as described above is positioned at the lower side relatively distant from the first trapping part 3 installed in the upper region of the housing in which the heater 2 installed. The second trapping part 4 allows the gas, which is introduced from the space region maintained at a temperature relatively lower than a temperature of the upper region, to flow downward from the third trapping structure 41 to the seventh trapping structure 45 while switching from the center direction to the outward direction and from the outward direction to the center direction through the gas movement holes, such that the flow path and the residence time are extended. The vortices are formed by the shield-type trapping plate portions, the guide-type trapping plates, the blade-type trapping plates, and the column-type trapping plate portions provided in the respective trapping structures and having various structures and the level differences therebetween, thereby providing a larger amount of reaction time and trapping the reaction by-product in the form of powder.

Figure 12:
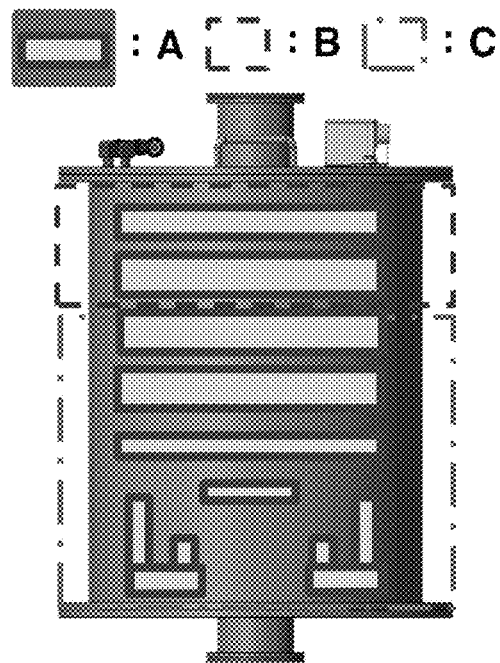
FIG. 12 is an exemplified view illustrating a trapping tendency in the reaction by-product trapping apparatus according to the embodiment of the present disclosure.

FIG. 12 is an exemplified view illustrating a trapping tendency in the reaction by-product trapping apparatus according to the embodiment of the present disclosure, and FIG. is an exemplified view illustrating a gas flow in the reaction by-product trapping apparatus according to the embodiment of the present disclosure.

Figure 13:
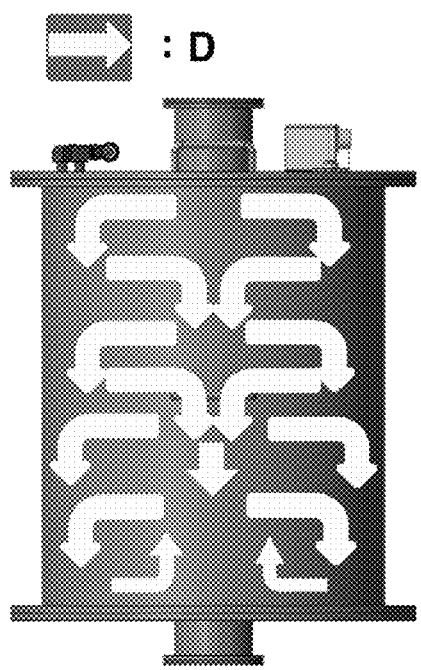
FIG. 13 is an exemplified view illustrating a gas flow in the reaction by-product trapping apparatus according to the embodiment of the present disclosure.

In FIG. 12, A indicates a reaction by-product trapping region, B indicates a region in which $Al_2O_3$ is mainly trapped from the reaction by-product mixtures, and C indicates a region in which SrO is mainly trapped from the reaction by-product mixtures. In addition, in FIG. 13, D indicates a gas flow path. In addition, the description of the following components may be replaced with the description described with reference to FIGS. 1 to 11.

As illustrated, according to the apparatus for trapping multiple reaction by-products according to the present disclosure, by the difference in vertical temperature distribution according to the distance from the heater positioned at the upper side and by the structure for switching the flow path directions and generating the vortices using the trapping structure including the first trapping part and the second trapping part positioned in the vertical direction, the flow in the movement direction of the gas introduced from above into the housing installed in the vertical direction is controlled, and the heat distribution region is divided. In the first trapping part corresponding to the upper region B in the reaction by-product trapping region A, the length of the flow path is increased by the trapping structure for switching the direction of the flow path of the lowered gas, and the residence time is extended, such that the reaction by-product, which is aggregated in the form of a thin film in a relatively high-temperature region, tends to be trapped on the surfaces of the plates. In the second trapping part corresponding to the lower region C, the path of the gas is switched to the zigzag direction by the trapping structures provided in multiple stages and having the level differences therebetween and by the structures having the holes having different sizes and arranged differently, such that the length of the flow path is increased, the multiple vortices are generated, the residence time of the gas is increased, and as a result, the reaction by-product, which is aggregated in the form of powder in a relatively low-temperature region, tends to be trapped. It can be seen that the flow of the gas according to the above-mentioned trapping tendency is similar to the tendency in the gas flow path D.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for trapping multiple reaction by-products for a semiconductor process, the apparatus comprising:
    a first trapping part (3) positioned in an upper region close to a heater (2) installed on a lower portion of an upper plate of a housing (1) and comprising a first trapping structure (31) and a second trapping structure (32) provided in multiple stages in a vertical direction; and
    a second trapping part (4) positioned below the first trapping part (3) and comprising a third trapping structure (41), a fourth trapping structure (42), a fifth trapping structure (43), a sixth trapping structure (44), and a seventh trapping structure (45) provided in multiple stages in the vertical direction,
    wherein the first trapping structure (31) includes
        a plurality of gas movement holes (311) arranged in a circular shape along a periphery of the first trapping structure (31), and
        guide-type trapping plates (312) formed on and protruded from the lower surface of the first trapping structure (31), the guide-type trapping plates being radially arranged toward the center of the first trapping structure,
    wherein the seventh trapping structure (45) is configured to trap the reaction by-product by generating vortices with multiple column-type trapping plate portions (452), which are disposed such that a level difference therebetween decreases in a center direction, while switching the flow path of the gas flowing downward from the sixth trapping structure (44) to the center direction, and
    wherein the column-type trapping plate portions (452) are configured such that a plurality of first column-type trapping plates (452*a*) each having a cross-shaped cross-section and having gas movement holes (452*a*') formed on blade surfaces facing the gas flow is arranged in a circular shape at the outermost side, and a plurality of second column-type trapping plates (452*b*) each having a cross-shaped cross-section, having a smaller height than each of the first column-type trapping plates (452*a*), and having gas movement holes (452*b*') formed on the blade surfaces facing the gas flow is arranged in a circular shape inside the first column-type trapping plates (452*a*).

2. The apparatus of claim 1, wherein the housing (1) comprises:
    a housing main body (11) configured to accommodate the introduced gas;
    an upper plate (12) having a coolant flow path part (12*b*) and a gas inlet port (12*a*) protruding upward and configured to fix and support a part of the first trapping part (3) and a part of the second trapping part (4) which are positioned below the upper plate and hung on the upper plate;
    a lower plate (13) having a gas discharge port (13*a*) protruding in both upward and downward directions and having a support portion for fixing the second trapping part (4); and
    a discharge port cover (14) installed to be spaced apart from the lower plate at a predetermined interval and configured to guide a flow path of the discharged gas while preventing the reaction by-product from dropping onto the gas discharge port (13a).

3. The apparatus of claim 1, wherein the second trapping structure (32) is installed such that a circumferential surface thereof is disposed to abut or be adjacent to an inner wall of the housing to prevent the gas, flowing downward from the first trapping structure (31), from flowing downward along the periphery of the second trapping structure (32), and the second trapping structure (32) traps the reaction by-product through upper and lower surfaces of the second trapping structure (32) and through blade-type trapping plates (322) formed on the upper surface of the second trapping structure (32) while switching the flow path to a gas movement hole (321) formed at a central portion thereof and lowering the gas downward.

4. The apparatus of claim 3, wherein the plurality of blade-type trapping plates (322) is radially arranged and installed, and one or more load blades (322a) protruding from each of the blade-type trapping plates (322) in a transverse direction has an upper end inclined in a circumferential direction.

5. The apparatus of claim 1, wherein the third trapping structure (41) is configured to trap the reaction by-product by generating vortices with multiple shield-type trapping plate portions (412), which are disposed such that a level difference therebetween increases in an outward direction, while switching the flow path of the gas flowing downward from the second trapping structure (32) of the first trapping part to the outward direction and lowering the gas through gas movement holes (411) formed along the periphery of the third trapping structure (41).

6. The apparatus of claim 5, wherein the shield-type trapping plate portions (412) are configured such that a plurality of first trapping pieces (412a) having gas movement holes (412a') is arranged in a circular shape and disposed at the innermost side so as to face the gas flow, a plurality of second trapping pieces (412b) each having a larger size than each of the first trapping pieces and having gas movement holes (412b') is arranged in a circular shape and disposed at the outer periphery of the first trapping pieces so as to face the gas flow, and a cylindrical trapping body (412c) having a larger size than each of the second trapping pieces and having a plurality of gas movement holes (412c') arranged in a surface thereof is disposed at the outer periphery of the second trapping pieces.

7. The apparatus of claim 1, wherein the fourth trapping structure (42) is configured to trap the reaction by-product by generating vortices with multiple shield-type trapping plate portions (422), which are disposed such that a level difference therebetween increases in the center direction, while switching the flow path of the gas flowing downward from the third trapping structure (41) to the center direction and lowering the gas through a gas movement hole (421) formed at the central portion thereof.

8. The apparatus of claim 7, wherein the shield-type trapping plate portions (422) are configured such that a plurality of first trapping pieces (422a) having gas movement holes (422a') is arranged in a circular shape and disposed at the outermost side so as to face the gas flow, a plurality of second trapping pieces (422b) each having a larger size than each of the first trapping pieces and having gas movement holes (422b') is arranged in a circular shape and disposed inside the first trapping pieces (422a) so as to face the gas flow, and a cylindrical trapping body (422c) having a larger height than each of the second trapping pieces and having a plurality of gas movement holes (422c') arranged in the surface thereof is disposed inside the second trapping pieces.

9. The apparatus of claim 1, wherein the fifth trapping structure (43) is configured to trap the reaction by-product while switching the flow path of the gas flowing downward from the fourth trapping structure (42) to an outward direction with guide-type trapping plates (431) and lowering the gas.

10. The apparatus of claim 9, wherein the guide-type trapping plates (431) are installed radially and each have a cross-shaped cross-section to widen a surface area thereof.

11. The apparatus of claim 1, wherein the sixth trapping structure (44) is configured to trap the reaction by-product with blade-type trapping plates (442) while switching the flow path of the gas flowing downward from the fifth trapping structure (43) to the center direction and lowering the gas through a gas movement hole (441) formed at a central portion thereof.

12. The apparatus of claim 11, wherein the blade-type trapping plates is radially arranged and installed, and one or more load blades protruding from each of the blade-type trapping plates in a transverse direction has an upper end inclined in a circumferential direction.

* * * * *